United States Patent
Eberhard et al.

(10) Patent No.: US 7,742,677 B2
(45) Date of Patent: Jun. 22, 2010

(54) METHOD FOR PRODUCING AN OPTOELECTRONIC COMPONENT

(75) Inventors: Franz Eberhard, Regensburg (DE); Uwe Strauss, Bad Abbach (DE); Ulrich Zehnder, Regensburg (DE); Andreas Weimar, Regensburg (DE); Raimund Oberschmid, Sinzing (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 336 days.

(21) Appl. No.: 11/810,326

(22) Filed: Jun. 4, 2007

(65) Prior Publication Data

US 2007/0238210 A1    Oct. 11, 2007

Related U.S. Application Data

(62) Division of application No. 11/120,514, filed on May 2, 2005, now Pat. No. 7,227,191.

(30) Foreign Application Priority Data

Apr. 30, 2004  (DE) ................... 10 2004 021 419
May 25, 2004  (DE) ................... 10 2004 025 610

(51) Int. Cl.
  *G02B 6/00*  (2006.01)
(52) U.S. Cl. .................. 385/147; 385/14; 438/24; 438/39; 438/48; 438/739; 438/947
(58) Field of Classification Search ............ 438/39, 438/24, 48, 739, 947; 385/14, 147
See application file for complete search history.

(56) References Cited

U.S. PATENT DOCUMENTS 5,233,204 A    8/1993  Fletcher et al.

6,893,889 B2 *   5/2005  Park et al. .............. 438/22
2002/0036286 A1   3/2002  Ho et al.

(Continued)

FOREIGN PATENT DOCUMENTS

DE    199 21 987    11/1999

(Continued)

OTHER PUBLICATIONS

Hyunsoo Kim et al., "Design and Fabrication of Highly Efficient GaN-Based Light-Emitting Diodes", IEEE Transactions on Electron Devices, vol. 49, No. 10, Oct. 2002.

(Continued)

*Primary Examiner*—Jennifer Doan
(74) *Attorney, Agent, or Firm*—Cohen Pontani Lieberman & Pavane LLP

(57) ABSTRACT

A method for producing an optoelectronic component is disclosed. The method includes the steps of providing a substrate, applying a semiconductor layer sequence to the substrate, applying at least two current expansion layers to the semiconductor layer sequence, applying and patterning a mask layer, patterning the second current expansion layer by means of an etching process during which sidewalls of the mask layer are undercut, patterning the first current expansion layer by means of an etching process during which the sidewalls of the mask layer are undercut at least to a lesser extent than during the patterning of the second current expansion layer, and removing the mask layer.

9 Claims, 3 Drawing Sheets

U.S. PATENT DOCUMENTS

| | | |
|---|---|---|
| 2003/0122144 A1 | 7/2003 | Uemura et al. |
| 2003/0183824 A1 | 10/2003 | Doi et al. |
| 2004/0222434 A1 | 11/2004 | Uemura et al. |
| 2004/0262620 A1 | 12/2004 | Albrecht et al. |
| 2004/0266044 A1 | 12/2004 | Park et al. |

FOREIGN PATENT DOCUMENTS

| | | |
|---|---|---|
| EP | 0 224 614 | 6/1987 |
| EP | 0 551 001 | 7/1993 |

OTHER PUBLICATIONS

Shyi-Ming Pan et al., "Enhanced Output Power of InGaN-GaN Light-Emitting Diodes With High-Transparency Nickel-Oxide-Indium-Tin-OxideOhmic Contacts", IEEE Photonics Technology Letters, vol. 15, No. 5, May 2003.

Search Report dated Sep. 17, 2007 issued for the corresponding European Patent Application No. 05 00 8670.

* cited by examiner

METHOD FOR PRODUCING AN OPTOELECTRONIC COMPONENT

CROSS-REFERENCE TO RELATED APPLICATIONS

This is a divisional of application Ser. No. 11/120,514, filed on May 2, 2005 now U.S. Pat. No. 7,227,191 Priority is claimed on German Patent Application Nos. 10 2004 021 419.0, filed on Apr. 30, 2004 and 10 2004 025 610.1, filed on May 25, 2004. The entire content of application Ser. No. 11/120,514 is incorporated herein by reference.

BACKGROUND OF THE INVENTION

1. Field of the Invention

The invention relates to a method for producing an optoelectronic component having a semiconductor chip containing a semiconductor layer sequence with a radiation-emitting active zone, the semiconductor layer sequence having sidewalls, and a connection contact for impressing current into the active zone.

2. Description of the Related Art

Contact is made with radiation-emitting optoelectronic components generally by applying a metallic connection contact to the semiconductor chip which contains the active zone. That surface of the semiconductor chip which is provided for contact-making is often simultaneously provided for coupling out radiation, so that the connection contact, which is not transparent to the emitted radiation, can be applied only to a partial region of the surface.

Particularly in the production of electrical contacts on p-doped semiconductor layers of III-V nitride compound semiconductors, the problem arises in this case that the semiconductor layer adjoining the connection contact has such a high resistance that the current flow through the active zone is essentially effected only through the regions directly beneath the connection contact. This adversely affects the brightness and the efficiency of the optoelectronic component.

In order to obtain a low forward voltage and a uniform high brightness over the entire chip area, a largely homogeneous current density over the chip area is desirable. In order to obtain a lateral current density distribution that is as homogeneous as possible, U.S. Pat. No. 5,233,204, for example, discloses inserting between the connection contact and the underlying semiconductor layer a current expansion layer that is as thick as possible and has good conductivity, said current expansion layer being transparent to the emitted radiation.

Current expansion layers of this type should ensure an ohmic contact with the semiconductor and also be transparent and stable in respect of temperature and aging. Furthermore, the application of such a current expansion layer should be able to be integrated into the production process of the optoelectronic component in a simple manner. These multiple requirements considerably restrict the material selection for current expansion layers of this type.

A homogeneous current density over the chip area can be achieved in particular by means of a large-area current expansion layer which reaches as far as the sidewalls of the semiconductor chip. In this case, however, there is the risk of voltage flashovers occurring at the sidewalls of the semiconductor chip on account of electrostatic discharges (ESD). This risk exists particularly in the case of radiation-emitting semiconductor chips based on III-V nitride compound semiconductors since comparatively high internal electric fields occur in the case of the latter.

SUMMARY OF THE INVENTION

One object of the present invention is to provide an optoelectronic component which is distinguished by a lateral distribution of the current density that is as homogeneous as possible and at the same time by a high ESD strength.

Disclosed herein is an optoelectronic component having a semiconductor chip containing a semiconductor layer sequence with a radiation-emitting active zone, the semiconductor layer sequence having sidewalls. A connection contact is provided for impressing current into the active zone. A first current expansion layer adjoins a semiconductor layer of the semiconductor layer sequence and a second current expansion layer between the semiconductor layer sequence and the connection contact. The first current expansion layer has a larger sheet resistance than the second current expansion layer and forms an ohmic contact with the adjoining semiconductor layer. The second current expansion layer is applied to a partial region of the first current expansion layer which is at a distance from the sidewalls.

The sheet resistance is a quantity relative to a square unit area and is therefore often also referred to as square resistance or in the unit provided with an addition $\Omega$/square. For a sample having a square form and a constant thickness d, the sheet resistance is $R_s=\rho/d$, where $\rho$ is the resistivity of the material. Hereinafter, the SI unit $\Omega$ without characteristic additions is used throughout for the sheet resistance.

By virtue of the sheet resistance of the first current expansion layer being larger than, preferably at least twice as large as, and particularly preferably at least 10 times as large as, the second current expansion layer and by virtue of a distance between the second current expansion layer and the sidewalls of the semiconductor layer sequence which is preferably at least 100 nm, particularly preferably more than 1 µm, the risk of voltage flashovers at the sidewalls of the semiconductor chip is advantageously reduced and the ESD strength is thus increased.

The first current expansion layer can be at a distance of less than 3 µm from the sidewalls of the semiconductor layer sequence in the lateral direction or even reaches right up to the sidewalls. In particular, the first current expansion layer may also be applied to the semiconductor layer sequence over the whole area. This advantageously results in a homogeneous distribution of the current density within the optoelectronic component up to the sidewalls, as a result of which the brightness and the efficiency of the optoelectronic component are increased.

The sheet resistance of the first current expansion layer can be more than 1000$\Omega$ in order to obtain a high ESD strength. Such a high sheet resistance can be obtained for example by using a very thin first current expansion layer. The first current expansion layer is can be less than 2 nm thick.

In order to ensure a distribution of the current density that is as homogeneous as possible in normal operation of an optoelectronic component, the sheet resistance of the second current expansion layer should be as low as possible. The sheet resistance of the second current expansion layer can be between 1 $\Omega$ and 50 $\Omega$.

The second current expansion layer may be succeeded by one or else a plurality of further current expansion layers as seen from the semiconductor chip. The plurality of current expansion layers are preferably applied to one another in stepped fashion, so that each succeeding current expansion layer covers only a partial region of the current expansion layer preceding it.

The invention is not restricted to a specific embodiment of the semiconductor layer sequence. In particular, the optoelectronic component may have an arbitrary semiconductor layer sequence known for LEDs or laser diodes. The invention is particularly advantageous for optoelectronic components in which the semiconductor layer sequence contains a III-V nitride compound semiconductor material. In the case of optoelectronic components based on these semiconductor materials, the risk of an ESD voltage flashover at the sidewalls is particularly high since electric fields having an electric field strength of a few MV/cm can occur in the case of these components.

The semiconductor layer adjoining the first current expansion layer may be, in particular, a p-doped semiconductor layer of a III-V nitride compound semiconductor. In the case of p-doped III-V nitride compound semiconductors, the transverse conductivity is so low that, without the insertion of current expansion layers, the current flow would essentially be restricted to a region beneath the connection contact, and a large part of the emitted radiation would therefore be lost due to absorption in the connection contact.

In particular, the semiconductor layer sequence may contain the III-V nitride compound semiconductor material $Al_xGa_yIn_{1-x-y}N$, where $0 \leq x \leq 1$, $0 \leq y \leq 1$ and $x+y \leq 1$.

The first current expansion layer preferably contains one of the materials platinum, palladium or nickel. These are advantageously suitable for forming an ohmic contact on a III-V nitride compound semiconductor material. Producing the ohmic contact with the first current expansion layer means that there is a greater freedom in material selection in the case of the second current expansion layer. The latter may contain in particular Au, Pd, ZnO or ITO.

The invention is advantageous in particular for optoelectronic components having a semiconductor layer sequence having a width of 200 μm or less since these components require a distribution of the current density that is as homogeneous as possible right into the vicinity of the sidewalls in order to effectively utilize the comparatively small area of the semiconductor chip.

One aspect of the invention is directed to a method for producing an optoelectronic component featuring the method steps of a) providing a substrate, b) applying the semiconductor layer sequence to the substrate, c) applying the at least two current expansion layers to the semiconductor layer sequence, d) applying and patterning a mask layer, e) patterning the second current expansion layer by means of an etching process during which sidewalls of the mask layer are undercut, f) patterning the first current expansion layer by means of an etching process during which the sidewalls of the mask layer are undercut at least to a lesser extent than during the patterning of the second current expansion layer, and g) removing the mask layer.

Before the application of the mask layer, a protective layer made of a silicon oxide, a silicon nitride or a silicon oxide-nitride may advantageously be applied to the current expansion layer applied last, in order to protect the semiconductor layer sequence during the removal of the mask layer. Said protective layer may be removed in an etching process that follows later.

The patterning of the first current expansion layer is effected by means of an etching process, preferably by means of dry etching process, in which the sidewalls of the mask layer are undercut to a lesser extent than during the patterning—described below—of the second current expansion layer. The sidewalls of the mask layer are preferably not undercut at all during the patterning of the first current expansion layer. It is particularly advantageous if the semiconductor layer sequence is also patterned during this method step, that is to say using the same mask layer. The production outlay is thereby reduced.

The second current expansion layer is patterned by means of an etching process in which the sidewalls of the mask layer are undercut. This is preferably effected by means of a wet-chemical etching process. This involves using an etchant that does not etch the first current expansion layer and the semiconductor layer sequence. The protective layer that has been applied, if appropriate, is subsequently removed from the current expansion layers in a further etching process.

The method steps specified need not necessarily be carried out in the order described above. In particular, it is also possible to pattern firstly the second current expansion layer by means of an etching method in which the mask layer is undercut, and subsequently the first current expansion layer by means of an etching method in which the mask layer is undercut to a lesser extent or not at all.

DETAILED DESCRIPTION OF THE DRAWINGS

Identical or identically acting elements are provided with the same reference symbols in the figures.

Figure 1:
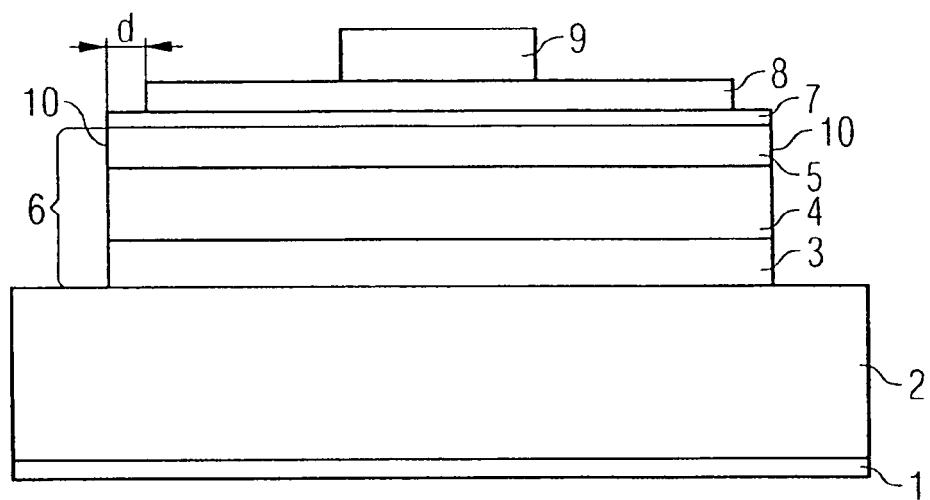
FIG. 1 shows a schematic illustration of a cross section through a first exemplary embodiment of an optoelectronic component according to the invention.

The optoelectronic component according to the invention as illustrated in FIG. 1 contains a substrate 2, to which a semiconductor layer sequence 6 is applied. The semiconductor layer sequence 6 contains at least one n-doped semiconductor layer 3 and at least one p-doped semiconductor layer 5, between which an active zone 4 is formed. The semiconductor layer sequence 6 has a mesa structure which is delimited by the sidewalls 10 in the lateral direction. The sidewalls 10 do not have to run perpendicularly to the semiconductor layer sequence 6, as illustrated in FIG. 1, but rather may alternatively also run obliquely with respect to the semiconductor layer sequence 6 or be curved.

A first current expansion layer 7 is applied to the p-doped semiconductor layer 5. A second current expansion layer 8 is applied to a partial region of the first current expansion layer 7, which partial region is at a distance d of more than 100 nm from the sidewalls 10 of the mesa structure in the lateral direction. The sheet resistance of the first current expansion layer 7 is at least a factor of 10 greater than the sheet resistance of the second current expansion layer 8. For the purpose of making electrical contact with the optoelectronic component, a first connection contact 1 is provided on that side of the substrate 2 which is remote from the semiconductor layer sequence 6, and a second connection contact 9 is provided on a partial region of the second current expansion layer 8.

Such a stepped arrangement of at least two current expansion layers 7, 8 between the semiconductor layer sequence 6 and the connection contact 9 has an advantageous effect on the operation of the radiation-emitting optoelectronic component in a number of respects. Firstly, a comparatively homogeneous current density distribution up to the vicinity of the sidewalls 10 of the mesa structure is achieved during the operation of the radiation-emitting optoelectronic component with the operating current being, for example, approximately 20 mA. A high brightness of the component and a comparatively low forward voltage can be achieved as a result.

The high sheet resistance of the first current expansion layer 7 reaching as far as the sidewalls of the semiconductor chip 10 simultaneously reduces the risk of voltage flashovers due to ESD voltage pulses at the sidewalls 10. The current density advantageously decreases within the second current expansion layer 8 by approximately 5% to 30% from the center toward the edge given an operating current of approximately 20 mA, by way of example. This current density gradient is more pronounced within the first current expansion layer 7 than in the second current expansion layer 8, e.g. 20% in the second current expansion layer and 40% in the first current expansion layer. In the case of high current intensities of approximately 1 A, for example, which occur in the case of an ESD pulse, the decrease in the current density toward the sidewalls 10 of the mesa structure is then great enough to ensure that no flashovers take place at the sidewalls 10.

Figure 2:
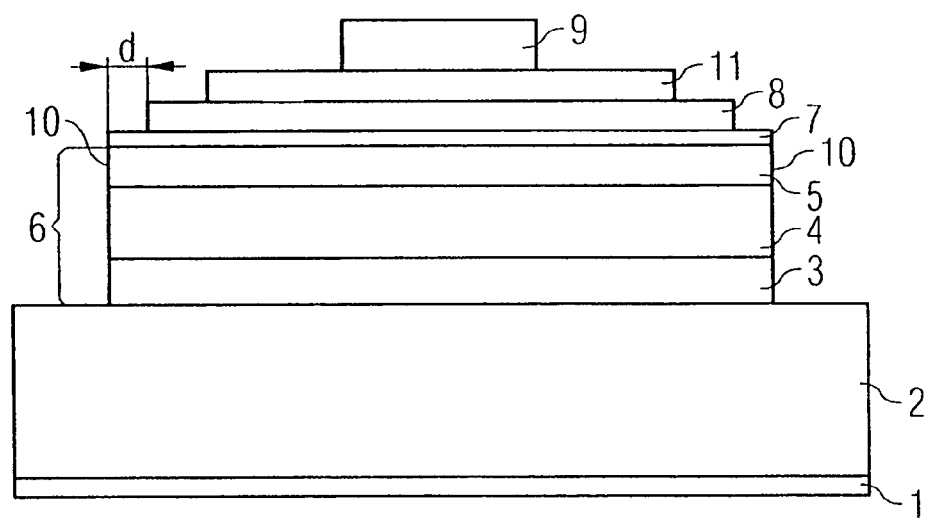
FIG. 2 shows a schematic illustration of a cross section through a second exemplary embodiment of an optoelectronic component according to the invention.

The exemplary embodiment as illustrated in FIG. 2 differs from that illustrated in FIG. 1 in that a third current expansion layer 11 is included between the second current expansion layer 8 and the connection contact 9, said third current expansion layer being applied to a partial region of the second current expansion layer 8. In the context of the invention, the third current expansion layer 11 may also be succeeded by still further current expansion layers in the direction toward the second connection contact 9, it being advantageous if each succeeding current expansion layer in each case covers a partial region of the current expansion layer preceding it and has a lower sheet resistance than the current expansion layer preceding it. This stepped arrangement of a plurality of current expansion layers 7, 8, 11 brings about a particularly homogenous lateral distribution of the current density in the optoelectronic component.

In the case of a radiation-emitting optoelectronic component in which the emitted radiation is coupled out through the current expansion layers, the current expansion layers should be at least semitransparent to the emitted radiation. The first current expansion layer 7 directly adjoining the semiconductor layer sequence 6 is furthermore subject to the requirement that it is intended to produce an ohmic contact with the adjoining semiconductor layer 5. The first current expansion layer 7 is preferably a metal layer which is less than 2 nm thick and contains Pt, Pd or Ni, by way of example. Preferred materials for the second current expansion layer are Au, Pd, ZnO and ITO.

The current expansion layers 7, 8, 11 may also be applied only in pointlike fashion or have a reticular or insular structure, for example, because the layer is so thin. In this case, closed current paths need not necessarily be formed within the current expansion layers in the lateral direction.

A semitransparent embodiment of the current expansion layers 7, 8, 11 is expedient if radiation is intended to be coupled out from the optoelectronic component through the regions covered by the current expansion layers. As an alternative, one or more of the current expansion layers 7, 8, 11 may also be embodied as reflective layers, for example in order to prevent absorption of emitted radiation in the connection contact 9. This embodiment is also advantageous when the optoelectronic component is an LED in which the radiation is coupled out in the lateral direction or through the substrate 2.

In the context of the invention, one or more of the current expansion layers 7, 8, 11 may have a variable layer thickness and/or composition in the lateral direction. More specifically, instead of depositing the current expansion layers in step-like fashion (e.g. as shown in FIGS. 1 and 2), the thickness of the layers may decrease from the center to the sidewalls, e.g. by etching curved sidewalls after deposition. This is a further advantageous possibility for setting the current density distribution in a targeted manner in the lateral direction.

FIGS. 3a to 3g illustrate various intermediate stages of a method according to the invention for producing an optoelectronic component.

Figure 3A:
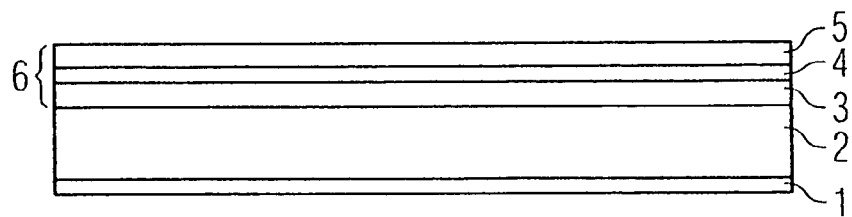
FIG. 3A-3G show schematic illustrations of intermediate steps of a method according to the invention for producing an optoelectronic component.

FIG. 3a shows a semiconductor substrate 2, to which a semiconductor layer sequence 6 is applied, the latter containing at least one n-doped semiconductor layer 3 and at least one p-doped semiconductor layer 5, between which a radiation-emitting active zone 4 is formed. The surface of the semiconductor layer sequence 6 may be roughened before the subsequent application of the current expansion layers. The rear side of the substrate 2 remote from the semiconductor layer sequence 6 is provided with a first connection contact 1.

Figure 3B:
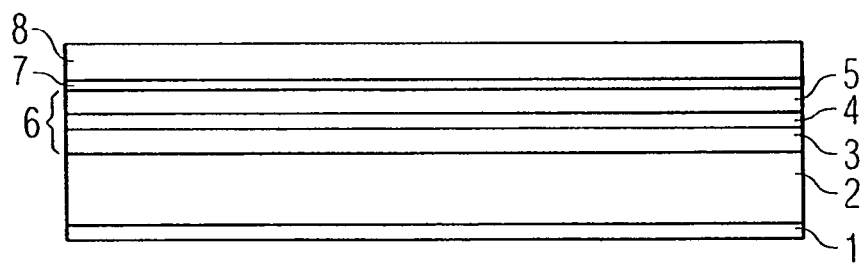

In the case of the intermediate step illustrated in FIG. 3b, a first current expansion layer 7, for example a platinum layer having a thickness of approximately 0.3 nm, and a second current expansion layer 8, for example a gold layer having a thickness of approximately 6 nm, are applied to the semiconductor layer sequence 6.

Figure 3C:
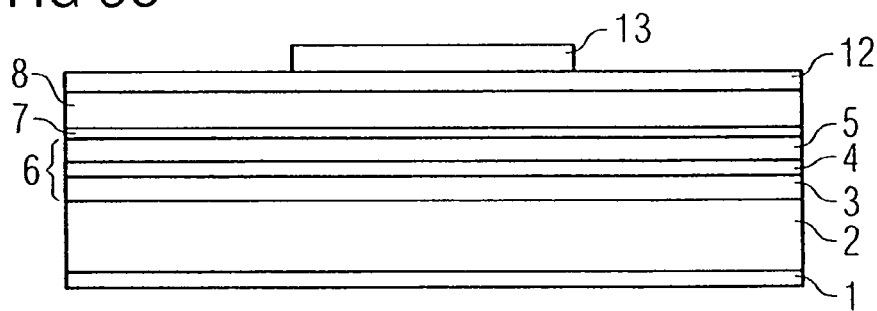

For the patterning of the current expansion layers 7, 8, firstly a mask layer 13, for example a photoresist layer, is applied, as illustrated in FIG. 3c. A protective layer 12 is advantageously applied to the second current expansion layer 8 before the application of the mask layer 13. The protective layer 12 is approximately 150 nm thick, by way of example. It preferably contains a silicon oxide, a silicon nitride or a silicon oxide-nitride.

Figure 3D:
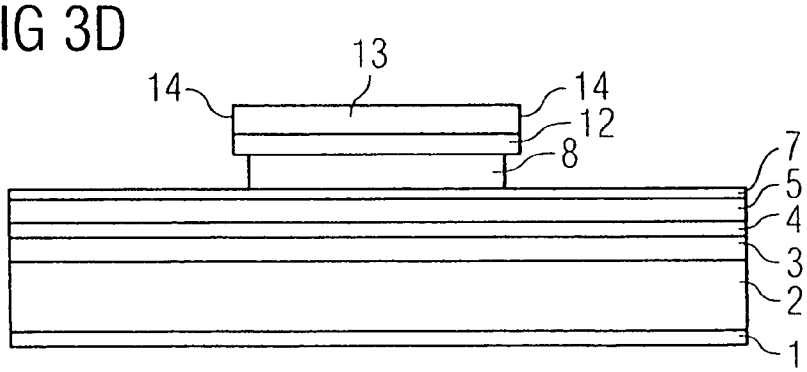

In the case of the intermediate step illustrated in FIG. 3d, the second current expansion layer 8 and the protective layer 12 have been patterned by means of a wet-chemical etching method in which the sidewalls 14 of the mask layer 13 are undercut. This involves using an etchant which does not attack, or only slightly attacks, the first current expansion layer 7. Therefore, the material of the second current expansion layer 8 must be able to be etched wet-chemically selectively with respect to the first current expansion layer.

The first current expansion layer 7 is subsequently patterned preferably by means of a dry etching process. During the dry etching process, the sidewalls 14 of the mask layer 13 are undercut only very little or not at all, so that the structure of the mask layer 13 is transferred to the first current expansion layer 7. In this case, a step forms between the first current expansion layer 7 and the second current expansion layer 8. It is particularly advantageous if the mesa structure of the semiconductor layer sequence 6 is also produced simultaneously during the dry etching process, thus giving rise to the structure illustrated in FIG. 3e. The step between the first current expansion layer 7 and the second current expansion layer 8 is intended to have a width at least such that the second current expansion layer 8 is at a distance of at least 100 nm from the sidewalls. It may possibly be necessary for this purpose to subsequently etch the second current expansion layer 8 wet-chemically after the formation of the mesa structure.

Figure 3E:
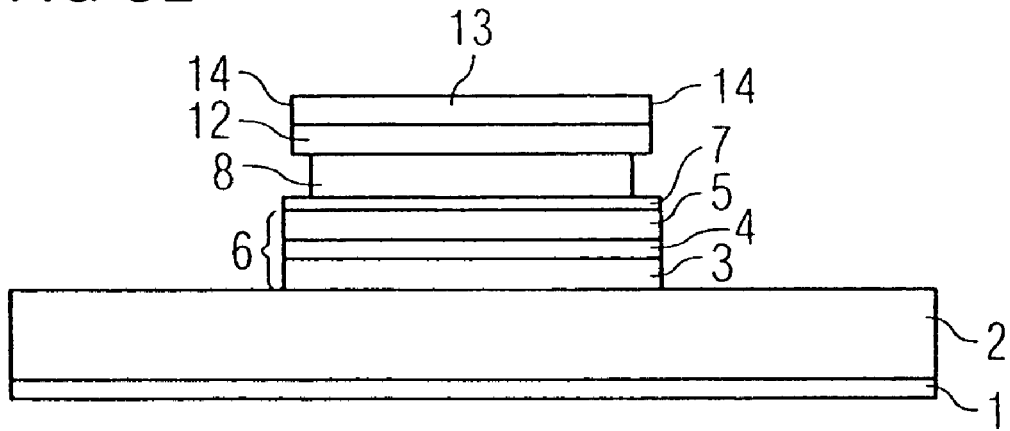

The method steps for patterning the current expansion layers 7, 8 and the semiconductor layer sequence 6 as explained in connection with FIGS. 3d and 3e may be carried out in any desired order, that is to say that it is possible to pattern either firstly the first current expansion layer and subsequently the second current expansion layer or firstly the second current expansion layer and subsequently the first current expansion layer. Irrespective of the order of the two etching steps, the advantage is afforded that only one phototechnological patterning of the mask layer 13 is required. A second application and patterning of a mask, which would significantly increase the production and alignment outlay, is not required, therefore. The total production outlay, in particular including the outlay in respect of costs, is therefore comparatively low in the case of this method.

Figure 3F:
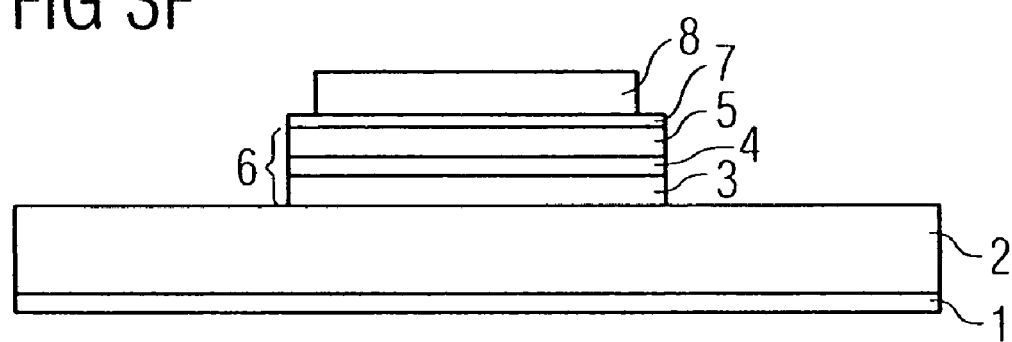

In a next method step, the protective layer 12 and the mask layer 13 are removed in a further etching step. The result of this intermediate step is illustrated in FIG. 3f.

Figure 3G:
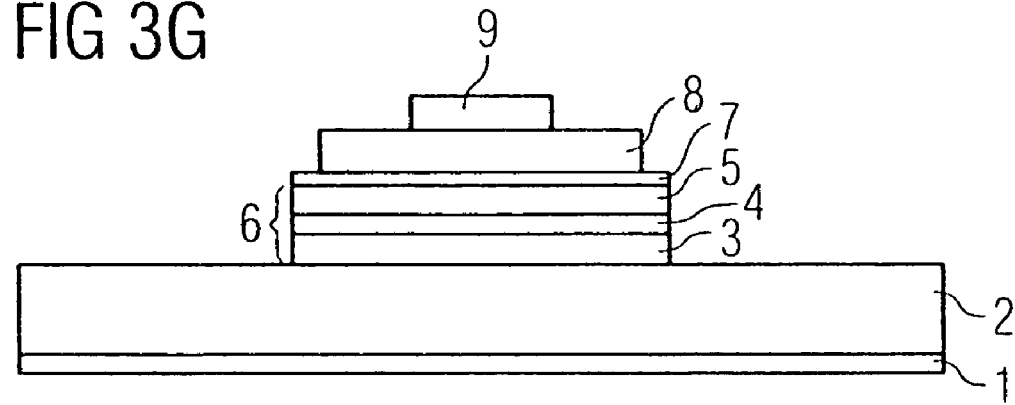

Afterward, the second connection contact 9 is applied to the second current expansion layer 8 and patterned. The optoelectronic component according to the invention that is produced in this way is illustrated in FIG. 3g.

The invention is not restricted by the description on the basis of the exemplary embodiments. Rather, the invention encompasses any new feature and also any combination of features, which in particular comprises any combination of features in the patent claims, even if this feature or this combination is itself not specified explicitly in the patent claims or exemplary embodiments.

What is claimed is:

1. A method for producing an optoelectronic component, the method comprising the steps of:
    a) providing a substrate;
    b) applying a semiconductor layer sequence to the substrate;
    c) applying at least first and second current expansion layers to the semiconductor layer sequence, the first current expansion layer being a metal layer;
    d) applying and patterning a mask layer;
    e) patterning the second current expansion layer by means of an etching process during which sidewalls of the mask layer are undercut;
    f) patterning the first current expansion layer by means of an etching process during which the sidewalls of the mask layer are undercut at least to a lesser extent than during the patterning of the second current expansion layer; and
    g) removing the mask layer.

2. The method as claimed in claim 1, wherein the semiconductor layer sequence is also patterned during the etching process in method step f).

3. The method as claimed in claim 1, wherein the patterning of the second current expansion layer is effected after the patterning of the first current expansion layer.

4. The method as claimed in claim 1, wherein the patterning of the second current expansion layer is effected by means of a wet-chemical etching process.

5. The method as claimed in claim 1, wherein the patterning of at least one of the first current expansion layer and the semiconductor layer sequence is effected by means of a dry etching process.

6. The method as claimed in claim 1, wherein between method steps c) and d), a protective layer is applied to the current expansion layer applied last and the protective layer is removed with the mask layer in method step g).

7. The method as claimed in claim 6, wherein the protective layer contains a silicon oxide, a silicon nitride or a silicon oxide-nitride.

8. The method as claimed in claim 1, wherein the metal layer comprises one of Pd, Pt and Ni.

9. The method as claimed in claim 1, wherein the metal layer has a thickness of less than 2 nm.

* * * * *